(12) United States Patent
Ichimura et al.

(10) Patent No.: US 8,659,927 B2
(45) Date of Patent: Feb. 25, 2014

(54) WIRING SUBSTRATE IN WHICH EQUAL-LENGTH WIRES ARE FORMED

(75) Inventors: Takashi Ichimura, Tokyo (JP); Takanobu Naruse, Kanagawa (JP); Chiaki Fujii, Kanagawa (JP)

(73) Assignees: Murata Manufacturing Co., Ltd, Kyoto (JP); Renesas Electronics Corporation, Kanagawa (JP)

( * ) Notice: Subject to any disclaimer, the term of this patent is extended or adjusted under 35 U.S.C. 154(b) by 315 days.

(21) Appl. No.: 13/156,049

(22) Filed: Jun. 8, 2011

(65) Prior Publication Data

US 2011/0305060 A1 Dec. 15, 2011

(30) Foreign Application Priority Data

Jun. 9, 2010 (JP) .................................. 2010-132354

(51) Int. Cl.
*G11C 5/06* (2006.01)

(52) U.S. Cl.
USPC ............................................ 365/63; 365/129

(58) Field of Classification Search
USPC .................................................. 365/63, 129
See application file for complete search history.

(56) References Cited

U.S. PATENT DOCUMENTS

| 6,397,312 | B1 | 5/2002 | Nakano et al. | |
| 7,773,689 | B2 * | 8/2010 | Dreps et al. | 375/295 |
| 7,796,420 | B2 * | 9/2010 | Lienau | 365/158 |

FOREIGN PATENT DOCUMENTS

| JP | 05-275960 | 10/1993 |
| JP | H11-25029 A | 1/1999 |
| JP | 2005-302810 A | 10/2005 |

OTHER PUBLICATIONS

Japanese Office Action "Notice of Grounds of Rejection" dated Sep. 4, 2012; Japanese Patent Application No. 2010-132354; with translation.

* cited by examiner

*Primary Examiner* — Son Dinh
*Assistant Examiner* — Nam Nguyen
(74) *Attorney, Agent, or Firm* — Studebaker & Brackett PC

(57) ABSTRACT

In a wiring substrate, a double data rate (DDR) memory and a memory controller controlling the DDR memory are mounted. Further, in the wiring substrate, plural equal-length wires connecting the DDR memory and the memory controller are formed. The plural equal-length wires include a differential transmission line, such as a clock wire transmitting a clock signal, which is connected via a common mode choke coil. The differential transmission line may have a wire length shorter than a wire length of another equal-length wire, by a wire length corresponding to delay time of a transmission signal due to the common mode choke coil.

8 Claims, 6 Drawing Sheets

WIRING SUBSTRATE IN WHICH EQUAL-LENGTH WIRES ARE FORMED

CROSS REFERENCE TO RELATED APPLICATIONS

The present application claims priority to Japanese Patent Application No. 2010-132354 filed Jun. 9, 2010, the entire contents of which is incorporated herein by reference in its entirety.

FIELD OF THE INVENTION

The present invention relates to a wiring substrate, and in particular to a wiring substrate having equal-length wires connecting a memory and a memory controller.

BACKGROUND

Recently, DDR (Double Data Rate) memories have been widely used in a variety of digital equipment including a personal computer and a server. Since a DDR memory has an independent clock signal, and transfers a data signal between the DDR memory and a memory controller at a high speed, it is necessary to transmit the clock signal and the data signal in synchronization with each other. Further, since the DDR memory transfers the data signal between the DDR memory and the memory controller at a high speed, it is necessary to equalize delay times (propagation times) in signal wires. A conventional DDR memory employs equal-length wires (equal-delay wires) in which wire lengths of signal wires are equalized using wires in a so-called meander shape, in which signal wires are serpentine, to equalize delay times (propagation times) in the signal wires.

Japanese Patent Laying-Open No. 5-275960 discloses a chip delay line for adjusting the wire length of an equal-length wire. The chip delay line has a tri-plate structure obtained by sandwiching both sides of a signal wire formed as a serpentine pressed film pattern between high dielectric layers, sandwiching both sides thereof between low dielectric layers, and further sandwiching both sides thereof between ground electrode patterns.

SUMMARY

The disclosure provides a wiring substrate that can reduce the wiring area of an equal-length wire while maintaining the quality of a signal waveform in a high frequency region.

A wiring substrate in accordance with an embodiment of the disclosure includes a memory and a memory controller controlling the memory mounted thereon, and a plurality of equal-length wires formed on the substrate for connecting the memory and the memory controller. The plurality of equal-length wires include a differential transmission line connected via a common mode choke coil.

In a more specific embodiment of the disclosure, the equal-length wire in the differential transmission line may have a wire length shorter than a wire length of another equal-length wire, by a wire length corresponding to delay time of a transmission signal due to the common mode choke coil.

In another more specific embodiment, the memory mounted on the wiring substrate is a DDR memory.

In yet another more specific embodiment of the disclosure, the equal-length wire in the differential transmission line may be a clock wire transmitting a clock signal.

The foregoing aspects of the disclosure will become more apparent from the following detailed description of the present invention when taken in conjunction with the accompanying drawings.

DETAILED DESCRIPTION

Figure 1:
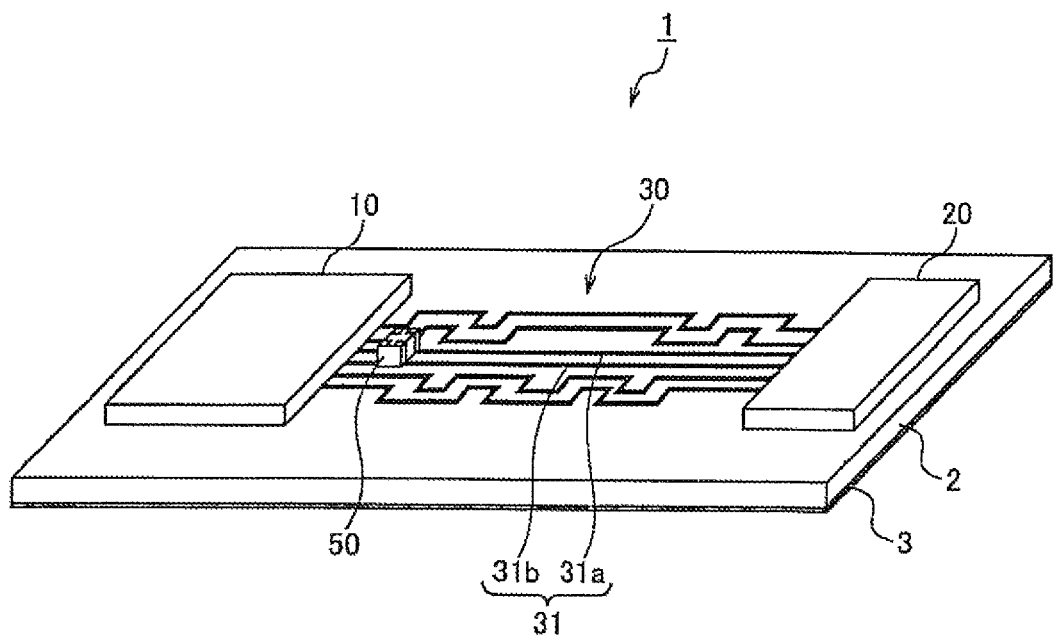
FIG. 1 is a perspective view schematically showing a configuration of a wiring substrate in accordance with an exemplary embodiment.

Hereinafter, an embodiment will be described in detail with reference to the drawings, in which identical parts will be designated by the same reference numerals, and the same description will not be repeated.

The inventors realized that the chip delay line disclosed in Japanese Patent Laying-Open No. 5-275960 has a problem that the quality of a signal waveform cannot be maintained in recent high-speed transmission because a high frequency signal is highly attenuated. Further, in the chip delay line disclosed in Japanese Patent Laying-Open No. 5-275960, a ground should be connected in addition to the signal wire, and thus a great effect cannot be expected from the viewpoint of reducing a wiring area. In particular, since multiple signal wires should have equal lengths in the DDR memory, there is a tendency that the wiring area on a wiring substrate is increased. Therefore, if the chip delay line disclosed in Japanese Patent Laying-Open No. 5-275960 is used, it is impossible to further decrease the wiring area.

Figure 2:
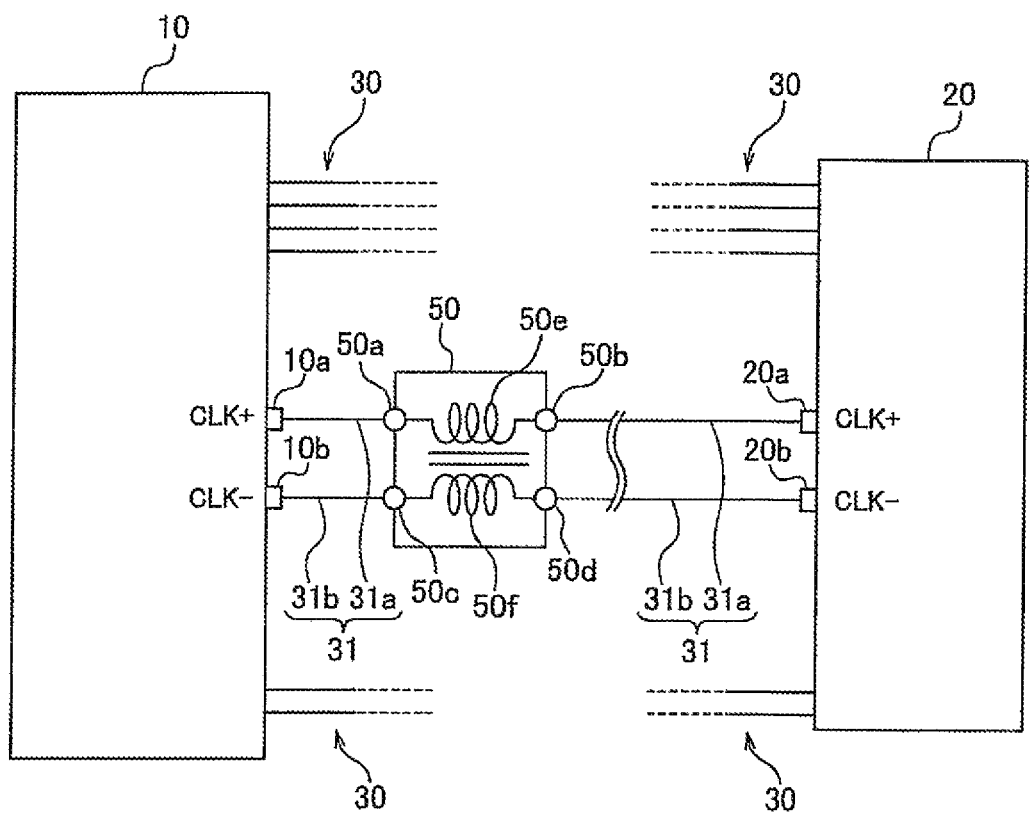
FIG. 2 is a circuit diagram showing a clock wire of the wiring substrate in accordance with the exemplary embodiment.

FIGS. 1 and 2 show a configuration of a wiring substrate 1 in accordance with an embodiment of the disclosure. FIG. 1 is a perspective view schematically showing a configuration of wiring substrate 1. FIG. 2 is a circuit diagram showing a clock wire of wiring substrate 1. It is to be noted that, in FIGS. 1 and 2, wires formed and electronic components mounted on wiring substrate 1 are partially shown to simplify the drawings.

Wiring substrate 1 includes, for example, a horizontally-long rectangular substrate 2 in the shape of a thin plate formed of an insulator (a dielectric) such as an insulating resin or ceramic, a parallel bus, which includes a plurality of equal-length wires hereinafter also referred to simply as a "bus" 30, formed on an upper surface (a mounting surface) of substrate 2, a ground layer 3 formed on a back surface of substrate 2, and the like. In wiring substrate 1, a DDR memory 20, a memory controller 10 controlling DDR memory 20, and the like are mounted on the mounting surface.

Examples of DDR memory 20 include a DDR SDRAM, which exchanges data at each of a rising edge and a falling edge of a clock signal and obtains a data transfer rate twice that of an SDRAM (Synchronous Dynamic Random Access Memory) operating on the same clock, a DDR2 SDRAM having a 4-bit prefetch function and a data transfer rate twice that of the DDR SDRAM, and a DDR3 SDRAM having a 8-bit prefetch function and a data transfer rate twice that of the DDR2 SDRAM. In the present embodiment, a DDR2 SDRAM is used.

Memory controller 10 controls a memory interface for reading/writing data, refreshing, and the like of DDR memory 20. Memory controller 10 may be, for example, a memory controller included in a chip set supplied together with a CPU, a memory controller implemented by an FPGA (Field Programmable Gate Array) or an ASIC (Application Specific Integrated Circuit), a microcontroller (one-chip microcomputer, system LSI, timing controller, or the like) having a built-in memory controller (or having a memory controller function), or the like.

Memory controller 10 and DDR memory 20 are connected by bus 30 formed of copper foil or the like. Bus 30 includes, for example, a clock wire (CLK) 31 transmitting a clock signal (CLK+Signal, CLK−Signal) determining timing based on which DDR memory 20 operates, a data strobe wire DQS transmitting a data strobe signal (DQS+Signal, DQS−Signal) designating timing for reading/writing data, an address wire ADR transmitting an address signal (ADR Signal) specifying the cell position of a memory array, a data wire DQ transmitting a data signal (DQ Signal), and the like.

It is to be noted that clock wire 31, which is important to provide operation timing, is disposed in the vicinity of the center of bus 30. Further, address wire ADR and data wire DQ are wired in a single-ended configuration, and clock wire 31 and data strobe wire DQS are wired using differential transmission lines to prevent a malfunction. Since data is transferred between DDR memory 20 and memory controller 10 at a high speed, it is necessary to transmit the clock signal and the data signal and the like in synchronization with one another. That is, it is necessary to equalize delay times (propagation times) in signal wires constituting bus 30. Thus, wires in a so-called meander shape, in which signal wires are serpentine, are used except for clock wire 31 described later in detail, to equalize wire lengths of the signal wires to serve as equal-length wires (equal-delay wires).

Subsequently, clock wire 31 will be described in more detail with reference to FIG. 2. As described above, clock wire 31 is an equal-length wire in a differential transmission line interposed between memory controller 10 and DDR memory 20 for transmitting the clock signal, and includes a pair of a first signal line 31a and a second signal line 31b. The first signal line 31a transmits a clock signal (CLK+Signal), and the second signal line 31b transmits a clock signal (CLK−Signal) having a phase opposite to that of the clock signal (CLK+Signal) transmitted on first signal line 31a.

In clock wire 31, a common mode choke coil 50 is inserted on the memory controller 10 side (transmission side). More specifically, a first clock signal output terminal 10a of memory controller 10 outputting the clock signal (CLK+Signal) is connected, through the first signal line 31a constituting clock wire 31, to a first terminal 50a of common mode choke coil 50. Further, a second clock signal output terminal 10b of memory controller 10 outputting the clock signal (CLK−Signal) is connected, through the second signal line 31b constituting clock wire 31, to a third terminal 50c of common mode choke coil 50.

On the other hand, a first clock signal input terminal 20a of DDR memory 20 receiving the clock signal (CLK+Signal) is connected, through the first signal line 31a, to a second terminal 50b of common mode choke coil 50. A second clock signal input terminal 20b of DDR memory 20 receiving the clock signal (CLK−Signal) is connected, through the second signal line 31b, to a fourth terminal 50d of common mode choke coil 50.

Here, clock wire 31 has a characteristic impedance matched to 100 a Generally, in a conventional differential transmission line, a damping resistor is inserted to match impedance and prevent irregularities in a signal waveform, and to lower a wave height value to shorten rising time of the signal waveform. However, in clock wire 31 into which common mode choke coil 50 is inserted, there is no need to insert a damping resistor. Therefore, a damping resistor is not mounted in clock wire 31.

Common mode choke coil 50 is a chip-type common mode choke coil including a pair of opposing coil bodies 50e, 50f and coated with a magnetic material or the like. In clock wire 31, its wire length is shortened due to insertion of common mode choke coil 50. Here, a method of shortening the wire length using common mode choke coil 50 will be described. To shorten clock wire 31, it is determined beforehand how many millimeters a wire length (pattern length) corresponding to delay time of a transmission signal due to common mode choke coil 50 corresponds to, and the wire length of clock wire 31 can be shortened by the wire length corresponding to the delay time of the transmission signal due to common mode choke coil 50.

Here, the delay time due to common mode choke coil 50 can be determined, for example, from simulation. More specifically, an S parameter of common mode choke coil 50 is actually measured to perform simulation in the case where a clock signal is input from a signal source. Then, a time difference between input and output waveforms is determined, and the result is converted into delay time (delay amount) to calculate a wire length. A delay time of 6 ps on the surface of the wiring substrate, and a delay time of 7 ps in an internal layer of the substrate correspond to a wire length of 1 mm The delay time due to common mode choke coil 50 may be determined by actual measurement.

With this configuration, the wire length of clock wire 31 is shortened by the wire length corresponding to the delay time of the transmission signal due to common mode choke coil 50. Thus, the meander shape of clock wire 31 is eliminated, and a wiring area of clock wire 31 is reduced. Further, since another signal wire (for example, data strobe wire DQS, address wire ADR, data wire DQ, or the like) can be consequently disposed in a region where the wiring area of clock wire 31 is reduced, a wiring area between DDR memory 20 and memory controller 10 is reduced as a whole.

On the other hand, since common mode choke coil 50 has a characteristic impedance matched to a differential impedance of 100Ω, it allows the clock signal to pass therethrough without attenuation when the clock signal is transmitted. Therefore, even if common mode choke coil 50 is inserted into clock wire 31 between DDR memory 20 and memory controller 10, the quality of the signal waveform is not degraded when compared with a conventional equal-length wire (wire in the meander shape).

As described above in detail, according to the exemplary embodiment, the wire length of clock wire 31 can be shortened by inserting common mode choke coil 50 having delay time larger than that in a substrate wire into clock wire 31 between DDR memory 20 and memory controller 10. Therefore, the meander shape of clock wire 31 can be eliminated, and the wiring area can be reduced.

Further, according to the exemplary embodiment, the wire length of clock wire 31 can be shortened by the wire length corresponding to the delay time of the transmission signal due to common mode choke coil 50. Therefore, by appropriately setting the delay time of the transmission signal due to common mode choke coil 50, the meander shape of clock wire 31 can be eliminated efficiently, and the wiring area can be reduced effectively. According to the exemplary embodiment, since the wire length of clock wire 31 disposed in the vicinity of the center of bus 30 is shortened on that occasion, the wiring area can be reduced more effectively. Further, since another signal wire can be disposed in the region where the wiring area of clock wire 31 is reduced, the wiring area between DDR memory 20 and memory controller 10 can be reduced as a whole.

On the other hand, according to the exemplary embodiment, since common mode choke coil 50 has a characteristic impedance matched to a differential impedance of 100Ω, even if common mode choke coil 50 is inserted into clock wire 31 between DDR memory 20 and memory controller 10 in which data is transferred at a high speed, the quality of the signal waveform is not degraded when compared with a conventional equal-length wire (wire in the meander shape).

As a result, according to the exemplary embodiment, a transmission line length of clock wire 31 can be shortened, that is, the wiring area can be reduced, while maintaining the quality of the waveform in a high frequency region.

Further, according to the exemplary embodiment, common mode choke coil 50 can remove a noise component (common mode component) included in the waveform of the clock signal on clock wire 31.

Figure 3:
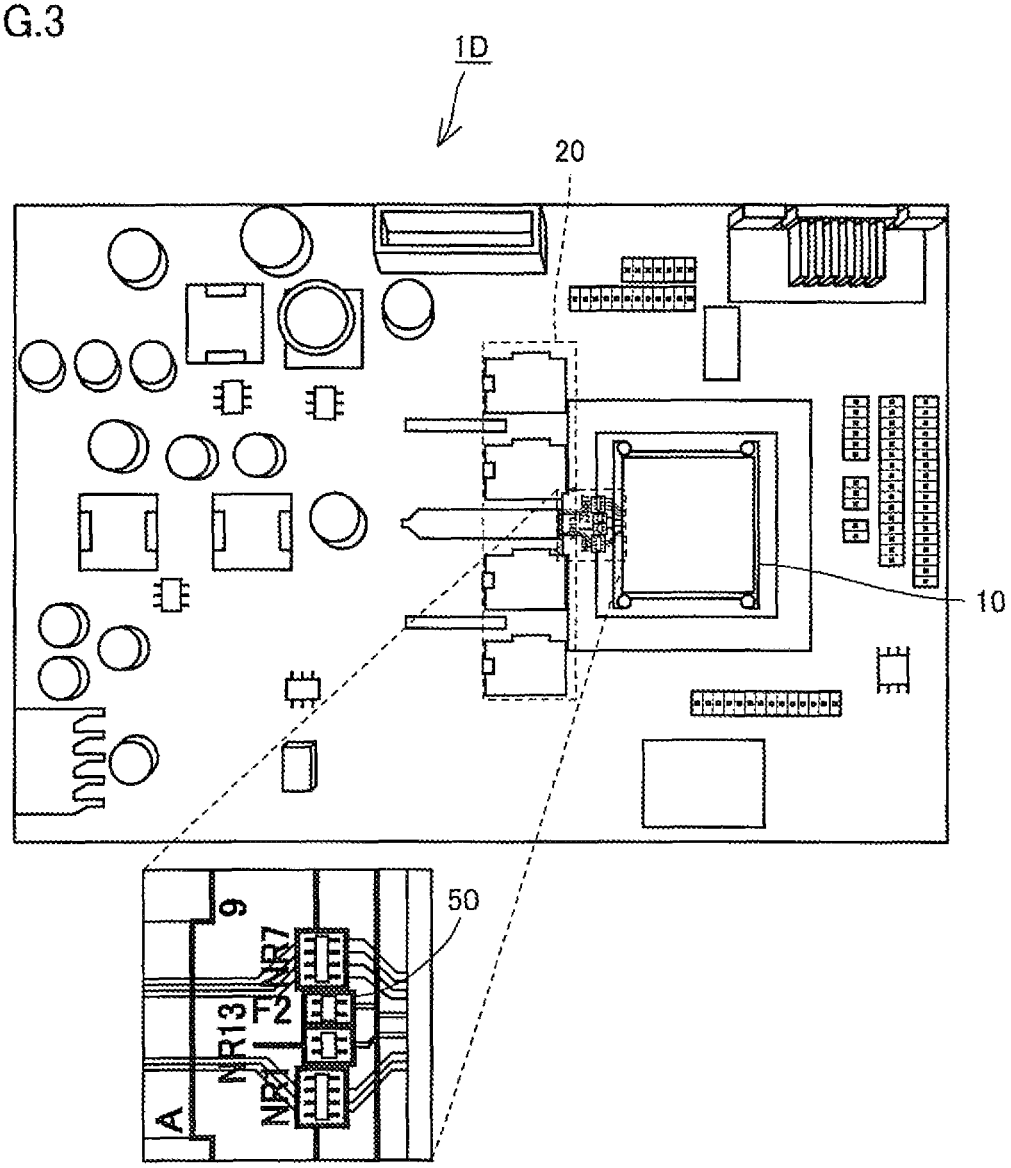
FIG. 3 is a view showing a mounting surface of an evaluation substrate, which is a wiring substrate in accordance with an exemplary embodiment.
Figure 4:
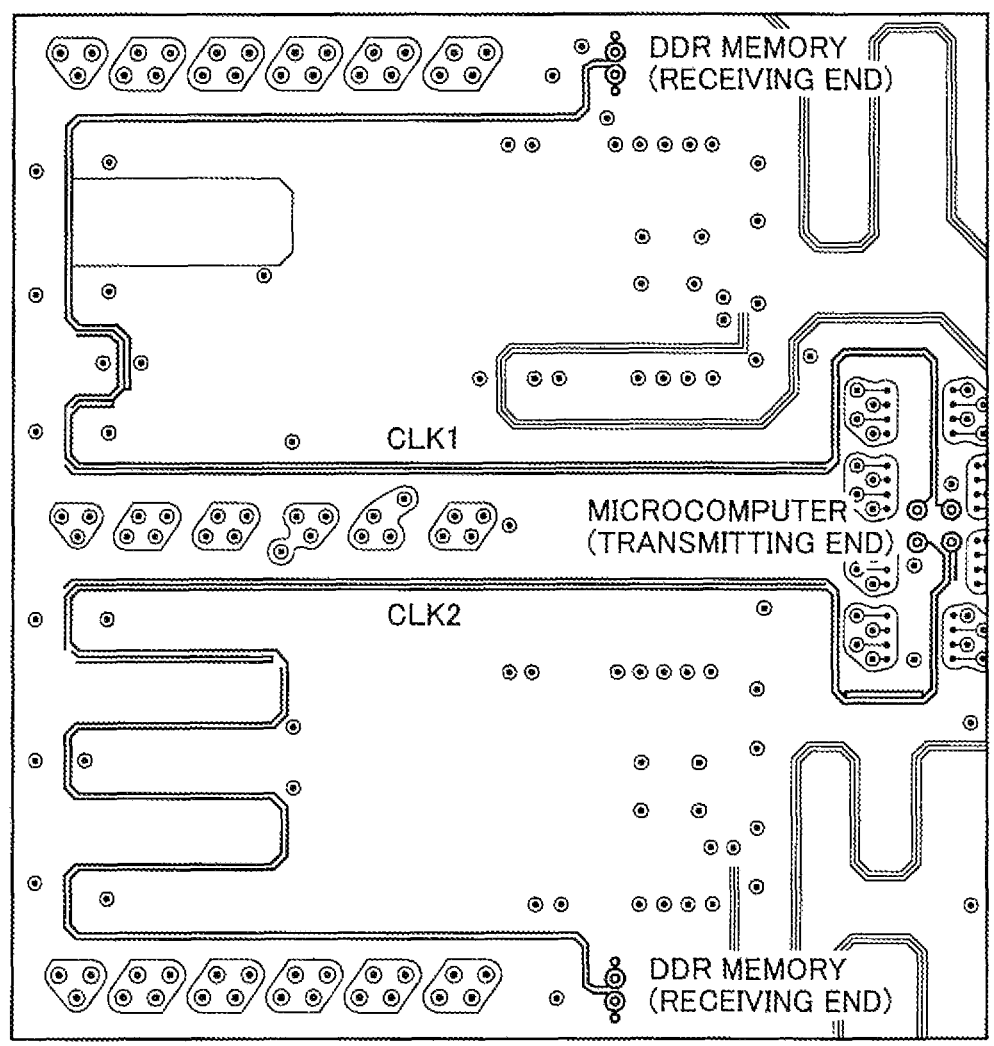
FIG. 4 is a view showing a clock wire into which a common mode choke coil is inserted and a clock wire using a conventional equal-length wire.

An exemplary evaluation wiring substrate was prepared to confirm the effect of shortening the wire length of clock wire 31, that is, the effect of reducing the wiring area in wiring substrate 1 in accordance with the exemplary embodiment. Subsequently, the effect of shortening the wire length (the effect of reducing the wiring area) in an evaluation substrate 1D will be described with reference to FIGS. 3 and 4. FIG. 3 is a view showing a mounting surface of evaluation substrate 1D. FIG. 4 is a view showing a clock wire CLK1 into which common mode choke coil 50 of FIG. 3 is inserted and a clock wire CLK2 using a conventional equal-length wire (wire in the meander shape) formed in an internal layer of evaluation substrate 1D.

As shown in FIG. 3, microcomputer (memory controller) 10, four DDR2 SDRAMs (DDR memories) 20, and the like are mounted in evaluation substrate 1D. In addition, one clock wire is connected for two DDR2 SDRAMs 20. That is, in evaluation substrate 1D, a total of two clock wires CLK1, CLK2 are provided between microcomputer 10 and DDR2 SDRAMs 20. Further, in evaluation substrate 1D, delay time in clock wire CLK1 was equalized by inserting common mode choke coil 50 (in this example, Murata Manufacturing Co., Ltd., DLP11SN331HL2), and delay time in clock wire CLK2 was equalized with those in signal wires such as data strobe wire DQS by increasing a wire length in a conventional manner.

Evaluation substrate 1D employs an arrangement in which DDR2 SDRAMs 20 are symmetrical with respect to microcomputer 10 (vertically symmetrical in the drawing). As shown in FIG. 4, the meander shape is eliminated in clock wire CLK1 into which common mode choke coil 50 of FIG. 3 is inserted. In contrast, the meander shape is seen in conventional clock wire CLK2 with no common mode choke coil 50 of FIG. 3 being inserted. More specifically, clock wire CLK1 into which common mode choke coil 50 was inserted had a wire length 26 mm shorter than that of clock wire CLK2 employing a conventional technique, and a reduction in the wiring area occupied by the wire was confirmed.

Subsequently, a waveform of a clock signal (CLK1 Signal) transmitted on clock wire CLK1 into which common mode choke coil 50 was inserted, and a waveform of a clock signal (CLK2 Signal) transmitted on clock wire CLK2 having an increased wire length were measured using evaluation substrate 1D described above, to confirm the quality of the signal waveform in wiring substrate 1 in accordance with the exemplary embodiment. Measurement results of the qualities of the waveforms of the signals on clock wires CLK1, CLK2 in evaluation substrate 1D described above will be described with reference to FIG. 5.

Figure 5:
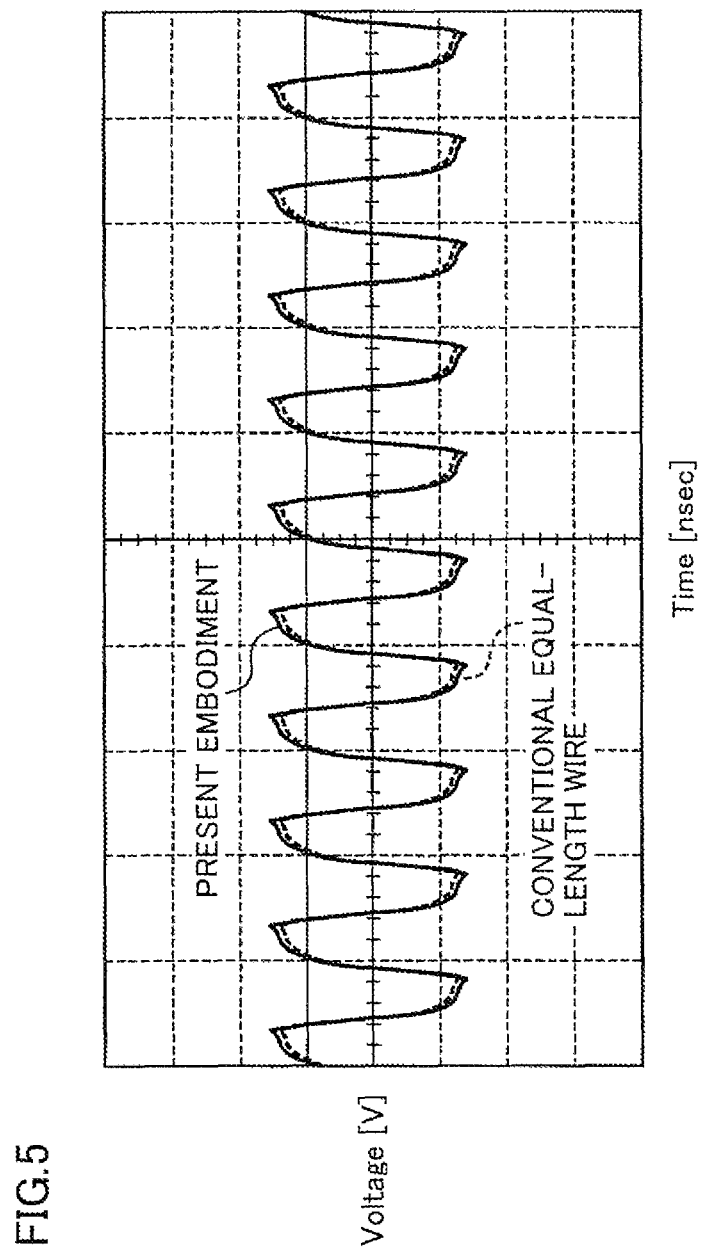
FIG. 5 is a graph showing a waveform of a clock signal transmitted on the clock wire into which the common mode choke coil is inserted and a waveform of a clock signal transmitted on a clock wire having an increased wire length, at clock receiving ends.

FIG. 5 is a view showing a waveform of the clock signal (CLK1 Signal) transmitted on clock wire CLK1 into which common mode choke coil 50 is inserted and a waveform of the clock signal (CLK2 Signal) transmitted on clock wire CLK2 having an increased wire length, at clock receiving ends. In a graph shown in FIG. 5, the axis of abscissas represents time (nsec), and the axis of ordinates represents voltage (V). In addition, in the graph shown in FIG. 5, the clock signal (CLK1 Signal) on clock wire CLK1 into which common mode choke coil 50 is inserted is indicated by a solid line, and the clock signal (CLK2 Signal) on clock wire CLK2 having an increased wire length is indicated by a broken (dashed) line.

As shown in FIG. 5, the signal waveforms of the clock signal (CLK1 Signal) and the clock signal (CLK2 Signal) measured at the receiving ends of DDR2 SDRAMs 20 substantially overlapped each other. In addition, the clock signal (CLK1 Signal) transmitted on clock wire CLK1 had an amplitude slightly larger than that of the clock signal (CLK2 Signal) transmitted on conventional clock wire CLK2. This is because a damping resistor (10Ω) is inserted into conventional clock wire CLK2 to shape the waveform and thus the amplitude of the clock signal (CLK2 Signal) is reduced, whereas there is no need to insert a damping resistor into clock wire CLK1 into which common mode choke coil 50 is inserted, and thus the signal waveform is not influenced by a damping resistor. As described above, it was confirmed that the quality of the signal waveform of the clock signal (CLK1 Signal) is not degraded even if common mode choke coil 50 is inserted into clock wire CLK1.

Next, a noise component (common mode component) included in the clock signal (CLK1 Signal) on clock wire CLK1 into which common mode choke coil 50 was inserted, and a noise component (common mode component) included in the clock signal (CLK2 Signal) on clock wire CLK2 having an increased wire length were measured using evaluation substrate 1D described above, to confirm the effect of reducing noise in wiring substrate 1 in accordance with the embodiment. Measurement results of the noise components included in the clock signals (CLK1 Signal, CLK2 Signal) on clock wires CLK1, CLK2 in evaluation substrate 1D will be described with reference to FIG. 6.

Figure 6:
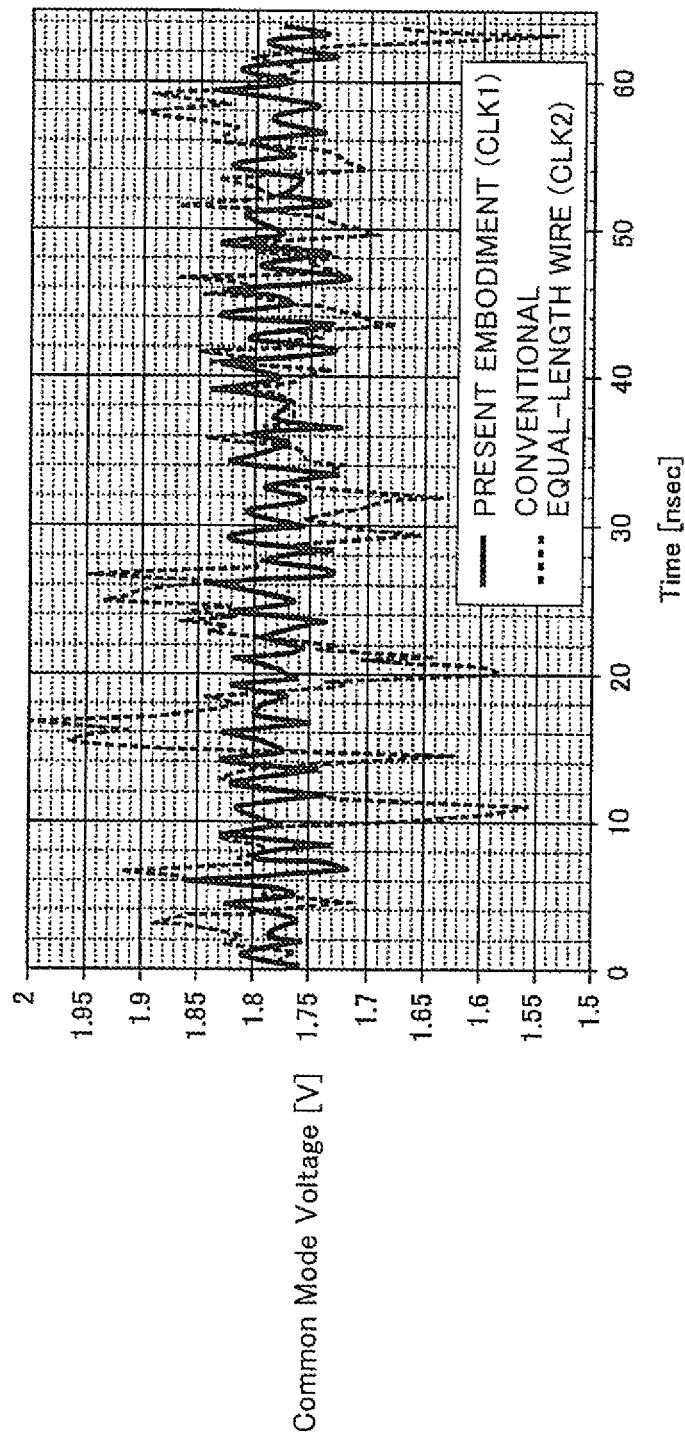
FIG. 6 is a graph showing a noise component included in the clock signal transmitted on the clock wire into which the common mode choke coil is inserted and a noise component included in the clock signal transmitted on the clock wire having an increased wire length, at clock receiving ends.

FIG. 6 is a view showing a noise component (common mode component) included in the clock signal (CLK1 Signal) transmitted on clock wire CLK1 into which common mode choke coil 50 is inserted and a noise component (common mode component) included in the clock signal (CLK2 Signal) transmitted on clock wire CLK2 having an increased wire length, at clock receiving ends. In a graph shown in FIG. 6, the axis of abscissas represents time (nsec), and the axis of ordinates represents voltage (V). In addition, in the graph shown in FIG. 6, the noise component (common mode component)

included in the clock signal (CLK1 Signal) on clock wire CLK1 is indicated by a solid line, and the noise component (common mode component) included in the clock signal (CLK2 Signal) on clock wire CLK2 is indicated by a broken (dashed) line.

As shown in FIG. 6, the clock signal (CLK1 Signal) transmitted on clock wire CLK1 has a noise component smaller than that of the clock signal (CLK2 Signal) transmitted on clock wire CLK2. More specifically, in conventional clock wire CLK2 with no common mode choke coil 50 being inserted, the noise component had an amplitude of about 0.5 V. In contrast, in clock wire CLK1 into which common mode choke coil 50 was inserted, the amplitude of the noise component was reduced to about 0.1 V. As described above, it was confirmed that noise included in the clock signal can be reduced by mounting common mode choke coil 50.

Although the embodiment of the present invention has been described, the embodiments of the disclosure are not limited to the exemplary embodiment described above, and various modifications are possible. For example, although common mode choke coil 50 is inserted into clock wire 31 in the above embodiment, common mode choke coil 50 may be inserted into another differential transmission line, for example, data strobe wire DQS, in addition to clock wire 31.

Further, a multilayer wiring substrate may be used as wiring substrate 1. In that case, the equal-length wire between DDR memory 20 and memory controller 10 may be formed in an internal layer of the substrate, without being limited to a surface layer of the substrate.

Although a DDR memory (DDR SDRAM, DDR2 SDRAM, DDR3 SDRAM) has been used as a memory in the above embodiment, the present invention is also applicable to, for example, a QDR (Quad Data Rate) memory transmitting data at four times the clock frequency, and the like, instead of the DDR memory.

According to embodiments of the disclosure, the wire length of the equal-length wire in the differential transmission line can be shortened by inserting the common mode choke coil having delay time (delay amount) larger than that in a substrate wire into the differential transmission line. Therefore, in the equal-length wire in the differential transmission line, wire shapes such as meander shape can be eliminated, and the wiring area can be reduced. Additionally, since the common mode choke coil has a characteristic impedance matched to a characteristic impedance of the differential transmission line, it allows a differential signal to pass therethrough without attenuation when the differential signal is transmitted on the differential transmission line. Therefore, even if the common mode choke coil is inserted into the differential transmission line between the memory and the memory controller, the quality of a signal waveform is not degraded when compared with a conventional equal-length wire. As a result, it becomes possible to reduce the wiring area of the equal-length wire while maintaining the quality of the signal waveform in a high frequency region.

Further, according to exemplary embodiments, since the common mode choke coil is inserted into the differential transmission line, a noise component (common mode component) included in a waveform of a signal transmitted on the differential transmission line can be removed. It is to be noted that, in the present specification, the term "equal-length wires" includes not only wires having a physically equal length, but also wires having an electrically equal length, that is, equal-delay wires having different actual lengths but equal delay time. In addition, the memory controller can include not only a memory controller included in a chip set supplied together with a CPU (Central Processing Unit), but also a microcontroller (one-chip microcomputer, system LSI (Large-Scale Integration), timing controller, or the like) having a built-in memory controller (or having a memory controller function), and the like.

In an embodiment where an equal-length wire in the differential transmission line as a wire length shorter than a wire length of another equal-length wire by a wire length corresponding to the delay time a transmission signal due to the common mode choke coil, by appropriately setting the delay time of the transmission signal due to the common mode choke coil, the meander shape of the equal-length wire may be eliminated efficiently, and the wiring area can be reduced effectively. Further, since another signal wire (equal-length wire) can be disposed in a region that has been occupied by the shortened differential transmission line, the wiring area can be reduced as a whole.

When a DDR memory is utilized as a memory mounted on the wiring substrate, since timing of reading/writing is strict in the DDR memory transmitting data at a rate (data rate) twice the clock frequency, equal-length wires having the meander shape are generally used to equalize wire lengths of wires. According to the wiring substrate in accordance with embodiments of the disclosure, the wire length of the equal-length wire in the differential transmission line can be shortened by inserting the common mode choke coil into the differential transmission line between the DDR memory and the memory controller. Therefore, the meander shape of the equal-length wire in the differential transmission line can be eliminated, and the wiring area can be reduced. Further, since the common mode choke coil has a characteristic impedance matched to the characteristic impedance of the differential transmission line as described above, the quality of the signal waveform is not degraded even if the common mode choke coil is inserted into the differential transmission line between the DDR memory and the memory controller in which data is transferred at a high speed.

In embodiments where the equal-length wire in the differential line is a clock wire transmitting a clock signal, because the clock wire is an important wire responsible for timing, generally, it is often disposed in the vicinity of the center of the plurality of equal-length wires (bus). Therefore, if an attempt is made to wire a plurality of wires to have an equal length using a conventional technique, it is required to set the wire length of the clock wire to be equal to the wire length of the longest wire formed at the outermost periphery, resulting in an increase in the wiring area. Here, according to the wiring substrate in accordance with the present invention, the wire length of the clock wire disposed in the vicinity of the center of the bus can be shortened. Therefore, the wiring area can be reduced more effectively.

According to embodiments of the disclosure, it becomes possible to reduce the wiring area of an equal-length wire while maintaining the quality of a signal waveform in a high frequency region.

It should be understood that the above-described embodiments are illustrative only and that variations and modifications will be apparent to those skilled in the art without departing from the scope and spirit of the disclosure. The scope of the present invention should be determined in view of the appended claims and their equivalents.

What is claimed is:
1. A wiring substrate, comprising:
 a substrate on which a memory and a memory controller controlling the memory are mounted; and
 a plurality of equal-length wires formed on said substrate for connecting said memory and said memory controller, said plurality of equal-length wires including a pair of differential transmission lines connected via a common mode choke coil.

2. The wiring substrate according to claim 1, wherein said equal-length wire in said differential transmission line has a wire length shorter than a wire length of another said equal-length wire, by a wire length corresponding to delay time of a transmission signal due to said common mode choke coil.

3. The wiring substrate according to claim 1, wherein said memory is a double data rate (DDR) memory.

4. The wiring substrate according to claim 2, wherein said memory is a DDR memory.

5. The wiring substrate according to claim 1, wherein said equal-length wire in said differential transmission line is a clock wire transmitting a clock signal.

6. The wiring substrate according to claim 2, wherein said equal-length wire in said differential transmission line is a clock wire transmitting a clock signal.

7. The wiring substrate according to claim 3, wherein said equal-length wire in said differential transmission line is a clock wire transmitting a clock signal.

8. The wiring substrate according to claim 4, wherein said equal-length wire in said differential transmission line is a clock wire transmitting a clock signal.

* * * * *